United States Patent
Li et al.

(10) Patent No.: US 12,453,281 B2
(45) Date of Patent: Oct. 21, 2025

(54) FUNCTIONAL MATERIAL, LIGHT-EMITTING SUBSTRATE AND MANUFACTURING METHOD THEREFOR, AND LIGHT-EMITTING APPARATUS

(71) Applicant: BOE TECHNOLOGY GROUP CO., LTD., Beijing (CN)

(72) Inventors: Yansong Li, Beijing (CN); Haidong Wu, Beijing (CN); Bei Wang, Beijing (CN); Xiaobo Du, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 436 days.

(21) Appl. No.: 17/927,542

(22) PCT Filed: Nov. 17, 2021

(86) PCT No.: PCT/CN2021/131144
§ 371 (c)(1),
(2) Date: Nov. 23, 2022

(87) PCT Pub. No.: WO2022/160875
PCT Pub. Date: Aug. 4, 2022

(65) Prior Publication Data
US 2023/0354698 A1 Nov. 2, 2023

(30) Foreign Application Priority Data
Jan. 27, 2021 (CN) .......................... 202110111865.5

(51) Int. Cl.
*H10K 85/60* (2023.01)
*H10K 59/12* (2023.01)
*H10K 59/35* (2023.01)
*H10K 50/17* (2023.01)

(52) U.S. Cl.
CPC ....... *H10K 85/631* (2023.02); *H10K 59/1201* (2023.02); *H10K 59/35* (2023.02); *H10K 50/17* (2023.02)

(58) Field of Classification Search
None
See application file for complete search history.

(56) References Cited

U.S. PATENT DOCUMENTS

2007/0145888 A1   6/2007  Yabunouchi et al.
2012/0012832 A1   1/2012  Yabunouchi et al.

FOREIGN PATENT DOCUMENTS

| CN | 102356060 A | 2/2012 |
| CN | 103594659 A | 2/2014 |
| CN | 108676025 A | 10/2018 |
| CN | 112928228 A | 6/2021 |

OTHER PUBLICATIONS

First Office Action for Chinese Patent Application No. 202110111865.5 issued by the Chinese Patent Office on Apr. 15, 2023.

*Primary Examiner* — Anthony Ho
(74) *Attorney, Agent, or Firm* — XSENSUS LLP

(57) ABSTRACT

A material with a hole injection function and/or a hole transport function includes a host material and a crystallisation inhibitor doped in the host material. The crystallisation inhibitor is capable of inhibiting crystallisation of the host material during evaporation, and the crystallisation inhibitor has a hole injection function and/or a hole transport function.

19 Claims, 2 Drawing Sheets

FUNCTIONAL MATERIAL, LIGHT-EMITTING SUBSTRATE AND MANUFACTURING METHOD THEREFOR, AND LIGHT-EMITTING APPARATUS

CROSS-REFERENCE TO RELATED APPLICATIONS

This application is a national phase entry under 35 USC 371 of International Patent Application No. PCT/CN 2021/131144 filed on Nov. 17, 2021, which claims priority to Chinese Patent Application No. 202110111865.5, filed on Jan. 27, 2021, which are incorporated herein by reference in their entirety.

TECHNICAL FIELD

The present disclosure relates to the field of lighting and display technologies, and in particular, to a material having a hole injection function and/or a hole transport function, a light-emitting substrate and a manufacturing method therefor, and a light-emitting apparatus.

BACKGROUND

Organic light-emitting diodes (OLEDs) are known as a next-generation "star" display technology due to characteristics of self-luminescence, wide viewing angle, fast response, high luminous efficiency, low operating voltage, thin substrate, capability of manufacturing large-sized and bendable substrates, and simple process.

SUMMARY

In an aspect, a material with a hole injection function and/or a hole transport function is provided. The material with the hole injection function and/or the hole transport function includes a host material and a crystallisation inhibitor doped in the host material. The crystallisation inhibitor is capable of inhibiting crystallisation of the host material during evaporation, and has a hole injection function and/or a hole transport function.

In some embodiments, the host material includes at least one of a hole injection material and a hole transport material.

In some embodiments, the host material includes a hole injection material and a hole transport material.

In some embodiments, the crystallisation inhibitor is any one selected from or a mixture of two or more selected from aromatic amine derivatives.

In some embodiments, the crystallisation inhibitor is any one selected from or a mixture of two or more selected from N,N'-Bis(3-methylphenyl)-N,N'-bis(phenyl)benzidine, N,N'-di(α-naphthyl)-N,N'-diphenyl-4,4'-naphthidine, N,N'-Bis(3,4-dimethylphenyl)-N,N'-bis(phenyl)benzidine, N,N,N',N'-Tetrakis(4-methylphenyl)benzidine, and 4,4',4"-Tris[phenyl(m-tolyl)amino]triphenylamine.

In some embodiments, based on 100 parts by weight of the material with the hole injection function and/or the hole transport function, there are 90 to 99 parts by weight of the host material and 1 to 10 parts by weight of the crystallisation inhibitor.

In some embodiments, there are 93 to 97 parts by weight of the host material, and the balance is the crystallisation inhibitor.

In some embodiments, in a case where the host material includes a hole injection material and a hole transport material, and the host material is determined in part by weight, there are 5 to 40 parts by weight of the hole injection material, and the balance is the hole transport material.

In some embodiments, there are 25 to 35 parts by weight of the hole injection material, and the balance is the hole transport material.

In some embodiments, the hole injection material is any one selected from or a mixture of two or more selected from Hexaazatriphenylenehexacarbonitrile, 2,3,5,6-Tetrafluoro-7,7,8,8-tetracyanoquinodimethane, and Tris(4-bromophenyl)ammoniumyl hexachloroantimonate.

In some embodiments, the hole transport material is any one selected from or a mixture of two or more selected from N,N'-Bis(1-naphthalenyl)-N,N'-bisphenyl-(1,1'-biphenyl)-4,4'-diamine, N,N'-diphenyl-N,N'-di(3-methylphenyl)-1,1'-biphenyl-4,4'-diamine, TPTE and 1,3,5-Tris[(3-methylphenyl)phenylamino]benzene.

In another aspect, a light-emitting substrate is provided. The light-emitting substrate includes a substrate and a plurality of light-emitting devices disposed on the substrate. At least one light-emitting device includes: a first electrode and a second electrode that are stacked; a light-emitting layer disposed between the first electrode and the second electrode; and a functional layer disposed between the first electrode and the second electrode. A material of the functional layer is the material with the hole injection function and/or the hole transport function as described above.

In some embodiments, the light-emitting substrate further includes a pixel defining layer having a plurality of openings. The plurality of light-emitting devices include a thin film with a hole injection function and/or a hole transport function that is disposed on a side of the pixel defining layer away from the substrate. The thin film with the hole injection function and/or the hole transport function includes a portion located in an opening in the openings and a portion located outside the openings. The portion of the thin film with the hole injection function and/or the hole transport function located in the opening constitutes the functional layer included in the light-emitting device.

In some embodiments, the functional layer is a hole injection layer disposed between the first electrode and the light-emitting layer, and a thickness of the hole injection layer is in a range of 1 nm to 10 nm, inclusive.

In some embodiments, the at least one light-emitting device includes at least one of a light-emitting device emitting red light, a light-emitting device emitting green light or a light-emitting device emitting blue light.

In yet another aspect, a light-emitting apparatus is provided. The light-emitting apparatus includes the light-emitting substrate as described above.

In yet another aspect, a manufacturing method of a light-emitting substrate is provided. The manufacturing method includes a following step.

A plurality of light-emitting devices are formed on a substrate. At least one light-emitting device is the light-emitting device as described above.

In some embodiments, in a case where the light-emitting substrate further includes a pixel defining layer having a plurality of openings, forming the plurality of light-emitting devices on the substrate includes a following step.

A thin film with a hole injection function and/or a hole transport function is formed on a side of the pixel defining layer away from the substrate on the substrate by an evaporation process. The thin film with the hole injection function and/or the hole transport function includes a portion located in an opening in the openings and a portion located outside the openings. The portion of the thin film with the hole injection function and/or the hole transport function located in the opening constitutes the functional layer included in the light-emitting device.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings.

In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
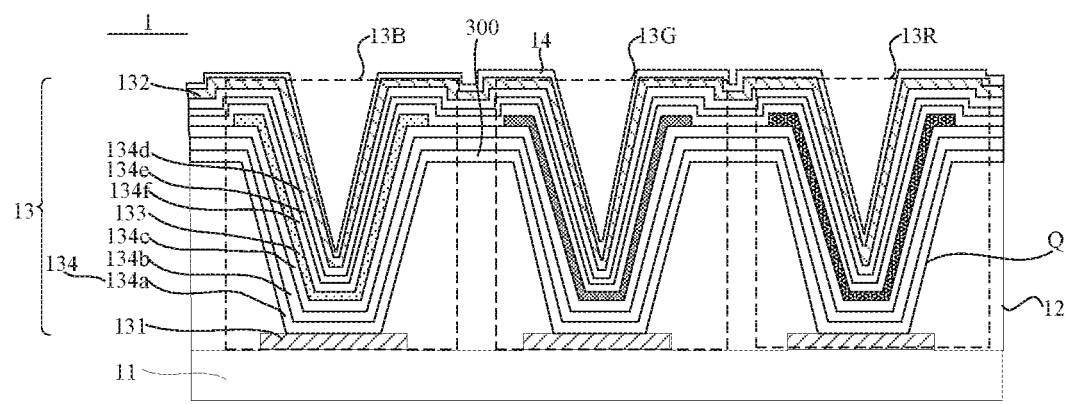
FIG. 1 is a sectional view of a light-emitting substrate, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other components, such as a circuit for providing electrical signals to the light-emitting substrate to drive the light-emitting substrate to emit light. The circuit may be referred to as a control circuit, and may include a circuit board and/or an integrated circuit (IC) electrically connected to the light-emitting substrate.

In some embodiments, the light-emitting apparatus may be a lighting apparatus, and in this case, the light-emitting apparatus serves as a light source to realize a lighting function. For example, the light-emitting apparatus may be a backlight module in a liquid crystal display apparatus, a lamp for internal or external lighting, or a signal lamp.

In some other embodiments, the light-emitting apparatus may be a display apparatus, and in this case, the light-emitting substrate is a display substrate for realizing a function of displaying an image (i.e., screen). The light-emitting apparatus may include a display or a product including a display. The display may be a flat panel display (FPD), or a microdisplay. The display may be a transparent display or an opaque display, depending on whether a user can see a scene behind the display. The display may be a flexible display or a normal display (which may be referred to as a rigid display), depending on whether the display is bendable or rollable. For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large area wall screen, a theater screen, or a stadium sign.

Some embodiments of the present disclosure provide the light-emitting substrate 1. As shown in FIG. 1, the light-emitting substrate 1 includes a substrate 11, a pixel defining layer 12 and a plurality of light-emitting devices 13 that are all disposed on the substrate 11. The pixel defining layer 12 has a plurality of openings Q. Light-emitting devices 13 may be arranged in one-to-one correspondence with openings Q. Here, the light-emitting devices 13 may be all or part of the plurality of light-emitting devices 13 included in the light-emitting substrate 1, and the openings Q may be all or part of the plurality of openings Q in the pixel defining layer 12.

In the plurality of light-emitting devices 13, at least one light-emitting device 13 may each include a first electrode 131, a second electrode 132, and a light-emitting layer 133 disposed between the first electrode 131 and the second electrode 132. Each light-emitting layer 133 may include a portion located in an opening Q.

In some embodiments, as shown in FIG. 1, the first electrode 131 may be an anode, and in this case, the second electrode 132 is a cathode. In some other embodiments, the first electrode 131 may be a cathode, and in this case, the second electrode 132 is an anode.

In some embodiments, a material of an anode may be selected from high work function materials, such as indium tin oxide (ITO), indium zinc oxide (IZO) and composite materials (such as Ag/ITO, Al/ITO, Ag/IZO and Al/ZO). Here, "Ag/ITO" refers to a stacked structure stacked by a metal silver electrode and an ITO electrode, "Al/ITO" refers to a stacked structure stacked by a metal aluminum electrode and an ITO electrode, "Ag/IZO" refers to a stacked structure stacked by a metal silver electrode and an IZO electrode, and "Al/IZO" refers to a stacked structure stacked by a metal aluminum electrode and an IZO electrode.

In some embodiments, a material of a cathode may be selected from low work function materials. For example, the material of the cathode may be one of metal materials Mg, Ag, Al, Li, K and Ca, or one of alloys $Mg_xAg_{(1-x)}$, $Li_xAl_{(1-x)}$, $Li_xCa_{(1-x)}$ and $Li_xAg_{(1-x)}$ of the foregoing metal materials, and the cathode may have a thickness in a range of 10 nm to 20 nm, inclusive. In the alloy $Mg_xAg_{(1-x)}$, x is a mass ratio of metal Mg in the alloy $Mg_xAg_{(1-x)}$, and the balance is metal Ag. In the alloy $Li_xAl_{(1-x)}$, x is a mass ration of metal Li in the alloy $Li_xAl_{(1-x)}$, and the balance is metal Al. By analogy, in the alloy $Li_xCa_{(1-x)}$, x is a mass ratio of metal Li in the alloy $Li_xCa_{(1-x)}$, and the balance is metal calcium. In the alloy $Li_xAg_{(1-x)}$, x is a mass ratio of metal Li in the alloy $Li_xAg_{(1-x)}$, and the balance is metal silver.

For an OLED light-emitting device, the light-emitting principle of the light-emitting device 13 is as follows. Through a circuit in which the anode and the cathode are connected, the anode injects holes into the light-emitting layer 133, and the cathode injects electrons into the light-emitting layer 133, so that the formed electrons and holes form excitons in the light-emitting layer 133, and the excitons transition back to a ground state by radiation to emit photons.

Driving circuits respectively connected to the light-emitting devices 13 may be further provided in the light-emitting substrate 1. The driving circuits may be connected to the control circuit, so as to drive respective light-emitting devices 13 to emit light according to the electrical signals input by the control circuit. The driving circuit may be an active driving circuit or a passive driving circuit.

The light-emitting substrate 1 may emit white light, monochromatic light (i.e., light of a single color), or color-adjustable light.

In a first example, the light-emitting substrate 1 may emit white light. In this case, as shown in FIG. 1, the at least one light-emitting device 13 includes light-emitting devices 13 with at least two light-emitting colors, such as light-emitting device(s) 13B each emitting blue light, light-emitting device(s) 13G each emitting green light and light-emitting device(s) 13R each emitting red light. In this case, by controlling the light-emitting device(s) 13B each emitting blue light, the light-emitting device(s) 13G each emitting green light, and the light-emitting device(s) 13R each emitting red light to emit light synchronously, light mixing may be realized, so that the light-emitting substrate 1 emits white light.

In this example, the light-emitting substrate 1 may be used for lighting, i.e., may be applied to a lighting apparatus.

In a second example, the light-emitting substrate 1 may emit monochromatic light. In a first case, light-emitting devices 13 (e.g., all of the plurality of light-emitting devices 13) included in the light-emitting substrate 1 each emit monochromatic light (e.g., red light). In this case, each light-emitting device 13 is a light-emitting device 13R emitting red light. In this case, red light emission may be realized by driving each light-emitting device 13 to emit light. In a second case, the light-emitting substrate 1 has a similar structure to the light-emitting devices 13 in the first example. In this case, by separately driving the light-emitting device(s) 13B each emitting blue light, the light-emitting device(s) 13G each emitting green light or the light-emitting device(s) 13R each emitting red light, monochromatic light emission may be realized.

In this example, the light-emitting substrate 1 may be used for lighting, i.e., may be applied to a lighting apparatus. Alternatively, the light-emitting substrate 1 may be used for displaying an image or a screen of a single color, i.e., may be applied to a display apparatus.

In a third example, the light-emitting substrate 1 may emit color-adjustable light (i.e., colored light). The light-emitting substrate 1 has a similar structure to the light-emitting devices in the first example. By controlling a brightness of each light-emitting device 13, a color and a brightness of mixed light emitted from the light-emitting substrate 1 may be controlled, so that colored light emission may be realized.

In this example, the light-emitting substrate 1 may be used for displaying an image or a screen, i.e., may be applied to a display apparatus. Of course, the light-emitting substrate 1 may also be applied to a lighting apparatus.

Figure 2:
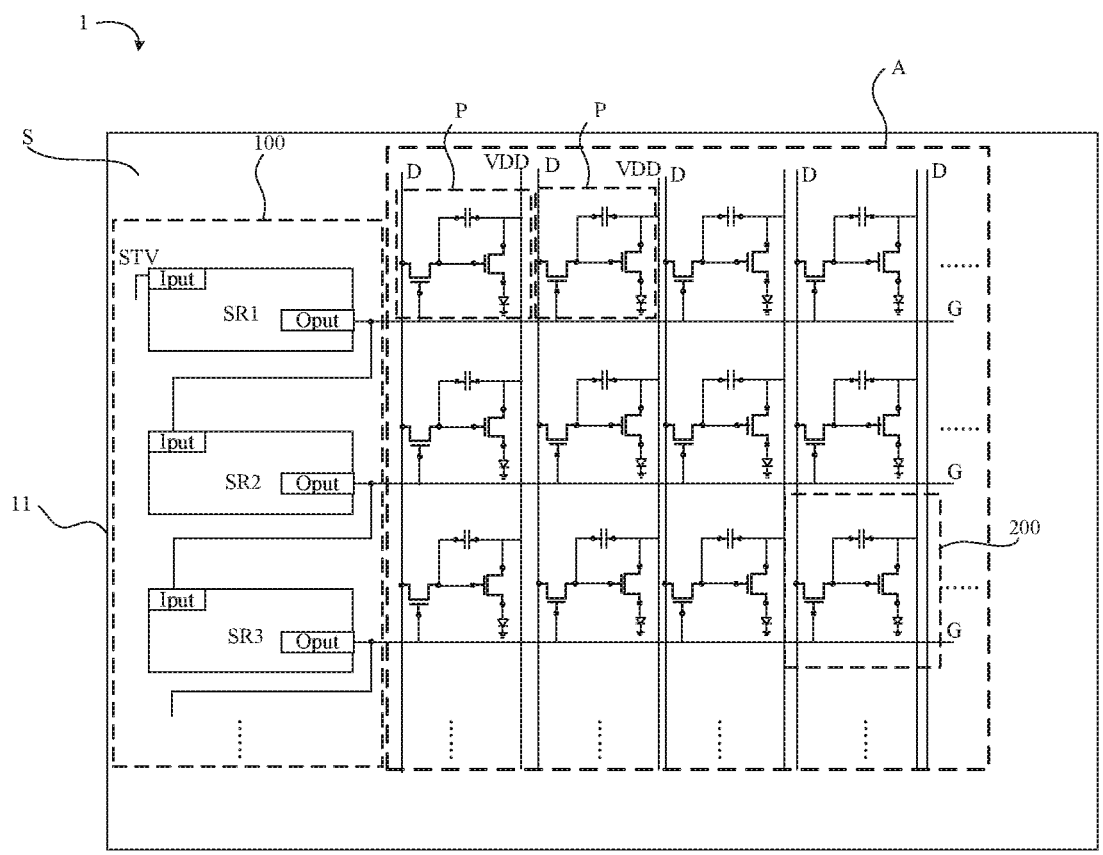
FIG. 2 is a top view of a light-emitting substrate, in accordance with some embodiments.

In the third example, in an example where the light-emitting substrate 1 is a display substrate, such as a full-color display panel, as shown in FIG. 2, the light-emitting substrate 1 has a display area A and a peripheral area S disposed on a periphery of the display area A. The display area A includes a plurality of sub-pixel regions P each corresponding to an opening, and an opening corresponds to a light-emitting device. Each sub-pixel region P is provided with a pixel driving circuit 200 for driving a corresponding light-emitting device to emit light. The peripheral area S is used for wiring, e.g., for providing a gate driving circuit 100 connected to the pixel driving circuit 200.

In some embodiments, as shown in FIG. 1, the light-emitting device 13 may further include functional layer(s) 134 disposed between the first electrode 131 and the second electrode 132.

According to the fact that the first electrode 131 may be an anode, it can be seen that the functional layer 134 may be any one of a hole injection layer 134a, a hole transport layer 134*b* and an electron blocking layer 134*c* disposed between the first electrode 131 and the light-emitting layer 133. According to the fact that the second electrode 132 may be a cathode, it can be seen that the functional layer 134 may be any one of an electron injection layer 134*d*, an electron transport layer 134*e* and a hole blocking layer 134*f* disposed between the second electrode 132 and the light-emitting layer 133.

In a case where the functional layer 134 is any one of the hole injection layer 134*a*, the hole transport layer 134*b* and the electron blocking layer 134*c*, a material of the functional layer 134 may be a material with a hole injection function and/or a hole transport function.

In a case where the functional layer 134 is any one of the electron injection layer 134*d*, the electron transport layer 134*e* and the hole blocking layer 134*f*, a material of the functional layer 134 may be a material with an electron injection function and/or an electron transport function.

In some embodiments, the material of the functional layer 134 is the material with the hole injection function and/or the hole transport function. That is, the functional layer 134 is any one of the hole injection layer 134*a*, the hole transport layer 134*b* and the electron blocking layer 134*c*. Moreover, the first electrode 131 is an anode, and the second electrode 132 is a cathode.

In some embodiments, as shown in FIG. 1, the plurality of light-emitting devices 13 include a thin film 300 with a hole injection function and/or a hole transport function that is disposed on a side of the pixel defining layer 12 away from the substrate 11. The thin film 300 with the hole injection function and/or the hole transport function includes portions each located in an opening Q and a portion located outside each opening Q. The portion of the thin film 300 with the hole injection function and/or the hole transport function located in the opening Q constitutes a functional layer 134 included in a light-emitting device 13. In this case, the thin film 300 with the hole injection function and/or the hole transport function may be formed by evaporation.

For example, the functional layer 134 may be the hole injection layer 134*a*. The thin film 300 with the hole injection function and/or the hole transport function may be formed by evaporating a material with a hole injection function and/or a hole transport function (e.g., a hole injection material).

Evaporation refers to a process of evaporating or sublimating a substance to be formed into a film in vacuum to precipitate the substance on a surface of a workpiece or a substrate. During evaporation, a crucible is used for containing an organic material, and a crucible opening is equipped with a crucible cover with a plurality of nozzles. By heating the crucible, the organic material in the crucible is sprayed out from the nozzles onto a substrate to form a film.

It will be noted that in the related art, in a case where a thin film with a hole injection function and/or a hole transport function is formed by evaporation to form a corresponding functional layer, for some materials with a hole injection function and/or a hole transport function, material crystallisation is easy to occur during evaporation, so that crystal blockage occurs in a mass production process, thereby affecting a thermal stability of a device.

Based on this, some embodiments of the present disclosure provide a material with a hole injection function and/or a hole transport function. The material with the hole injection function and/or the hole transport function includes a host material and a crystallisation inhibitor doped in the host material. The crystallisation inhibitor is capable of inhibiting crystallisation of the host material during evaporation. Moreover, the crystallisation inhibitor has a hole injection function and/or a hole transport function.

According to the fact that the material with the hole injection function and/or the hole transport function may be used for manufacturing any one of the hole injection layer 134*a*, the hole transport layer 134*b* and the electron blocking layer 134*c*, it can be seen that the material with the hole injection function and/or the hole transport function may be one of or a mixture of two or more of a hole injection material, a hole transport material and an electron blocking material.

For example, in a case where the material with the hole injection function and/or the hole transport function is used for manufacturing the hole injection layer 134*a*, the material with the hole injection function and/or the hole transport function focuses on having a good hole injection effect, and may be used for reducing an energy level difference between the cathode and the hole transport layer 134*b* when applied. In this case, the host material may be selected from the hole injection material, or a mixed material of the hole injection material and the hole transport material, or a hole transport material doped with a p-type dopant material.

In a case where the material with the hole injection function and/or the hole transport function is used for manufacturing the hole transport layer 134*b*, the material with the hole injection function and/or the hole transport function focuses on having a good hole transport effect, and needs to have a high hole mobility compared with the hole injection material. A highest occupied molecular orbital (HOMO) energy level of the material is between those of the hole injection layer 134*a* and the light-emitting layer 133. Therefore, in this case, the host material may be the hole transport material.

In a case where the material with the hole injection function and/or the hole transport function is used for manufacturing the electron blocking layer 134*c*, the material with the hole injection function and/or the hole transport function has a good hole transport effect, and further has a certain electron blocking effect. A lowest unoccupied molecular orbital (LUMO) energy level of the material is high. Therefore, in this case, the host material may be the electron blocking material.

In any of the above cases, the host material is easily crystallized during evaporation, by doping the host material with the crystallisation inhibitor, a technical effect of inhibiting the crystallisation of the host material may be achieved. Since the crystallisation inhibitor has the hole injection function and/or the hole transport function, properties of the host material itself are not affected after the addition of the crystallisation inhibitor, so that the industrial application may be realized.

A specific material of the crystallisation inhibitor is not limited, as long as after the host material is doped with the crystallisation inhibitor, the crystallisation of the host material is able to be inhibited during evaporation, and the properties of the host material itself are not affected.

In some embodiments, the crystallisation inhibitor is any one selected from or a mixture of two or more selected from aromatic amine derivatives. In the embodiments, since the aromatic amine derivative(s) themselves are formed into a dense film by evaporation and hardly crystallized, the crystallisation of the host material may be inhibited by selecting the aromatic amine derivative(s) as the crystallisation inhibitor and evaporating the same together with the host material that is easily crystallized.

In some embodiments, the crystallisation inhibitor is any one selected from or a mixture of two or more selected from N,N'-Bis(3-methylphenyl)-N,N'-bis(phenyl)benzidine, N,N'-di(α-naphthyl)-N,N'-diphenyl-4,4'-naphthidine, N,N'-Bis(3,4-dimethylphenyl)-N,N'-bis(phenyl)benzidine, N,N,N',N'-Tetrakis(4-methylphenyl)benzidine, and 4,4',4"-Tris[phenyl(m-tolyl)amino]triphenylamine.

A doping amount of the crystallisation inhibitor is not specifically limited. For host materials with different properties and functions, the doping amount of the crystallisation inhibitor may be different.

In some embodiments, based on 100 parts by weight of the material with the hole injection function and/or the hole transport function, there may be 90 to 99 parts by weight of the host material and 1 to 10 parts by weight of the crystallisation inhibitor.

Part by weight represents a mass ratio of each of several substances. Here, in an example where 1 part is 1 g, a total mass of the material with the hole injection function and/or the hole transport function is 100 g, a mass of the host material may be in a range of 90 g to 99 g, inclusive, and the balance is the crystallisation inhibitor.

For example, the total mass of the material with the hole injection function and/or the hole transport function is 100 g. In a case where the mass of the host material is 90 g, the mass of the crystallisation inhibitor is 100 g minus 90 g, which is equal to 10 g. In a case where the mass of the host material is 91 g, the mass of the crystallisation inhibitor is 100 g minus 91 g, which is equal to 9 g. In a case where the mass of the host material is 92 g, the mass of the crystallisation inhibitor is 100 g minus 92 g, which is equal to 8 g. By analogy, in a case where the mass of the host material is 99 g, the mass of the crystallisation inhibitor is 100 g minus 99 g, which is equal to 1 g.

In these embodiments, at a mass ratio within the above range, the crystallisation inhibitor may have a technical effect of inhibiting crystallisation without affecting the properties of the host material itself.

To further reduce the crystallisation, in some embodiments, based on 100 parts by weight of the material with the hole injection function and/or the hole transport function, there are 93 to 97 parts by weight of the host material and 3 to 7 parts by weight of the crystallisation inhibitor.

According to the fact that a hole injection layer and a hole transport layer are formed by evaporation in the related art, it can be seen that in some embodiments, the host material includes at least one of the hole injection material and the hole transport material. That is, the functional layer 134 is the hole injection layer 134a or the hole transport layer 134b.

In these embodiments, in a case where the host material includes the hole injection material, the functional layer 134 is the hole injection layer 134a. In a case where the host material includes the hole transport material, there are two cases. In a first case, the hole transport material is doped with a p-type dopant material, and the functional layer 134 is the hole injection layer 134a. In a second case, the hole transport material is undoped with a p-type dopant material, and the functional layer 134 is the hole transport layer 134b. In any of the above cases, by doping the host material with the crystallisation inhibitor, the technical effect of inhibiting the crystallisation of the host material is able to be achieved. Therefore, compared with the related art in which the thin film with the hole injection function and/or the hole transport function is formed by evaporation, when the thin film with the hole injection function and/or the hole transport function is formed by evaporation to form the functional layer in the related art, the problem of crystal blockage caused by the material crystallisation during evaporation is able to be solved. Moreover, it is found through experiments that compared with the related art in which a hole transport material doped with a p-type dopant material is directly used for evaporation as a host material, by doping the host material with the crystallisation inhibitor, signal crosstalks between the light-emitting device emitting red light, the light-emitting device emitting blue light and the light-emitting device emitting green light in the related art, which is caused 1s by an overhigh hole mobility due to doping the hole transport material with the p-type dopant material, are able to be reduced to some extent.

In some embodiments, the host material includes the hole injection material and the hole transport material. The hole injection material and the hole transport material may be doped or undoped with the p-type dopant material, which be set according to actual applications. In these embodiments, the material with the hole injection function and/or the hole transport function may serve as a material for manufacturing the hole injection layer, and the functional layer 134 may be the hole injection layer 134a. A thickness of the hole injection layer 134a may be in a range of 1 nm to 10 nm, inclusive.

In some embodiments, the hole injection material is any one selected from or a mixture of two or more selected from Hexaazatriphenylenehexacarbonitrile (HAT-CN), 2,3,5,6-Tetrafluoro-7,7,8,8-tetracyanoquinodimethane (F4-TCNQ), and Tris(4-bromophenyl)ammoniumyl hexachloroantimonate (TBAHA).

In some embodiments, the hole transport material is any one selected from or a mixture of two or more selected from N,N'-Bis(1-naphthalenyl)-N,N'-bisphenyl-(1,1'-biphenyl)-4,4'-diamine (NPB), N,N'-diphenyl-N,N'-di(3-methylphenyl)-1,1'-biphenyl-4,4'-diamine (TPD), triphenylamine tetramer (TPTE) and 1,3,5-Tris[(3-methylphenyl)phenylamino]benzene (m-TDAB).

In some embodiments, in a case where the host material includes the hole injection material and the hole transport material, and the host material is determined in part by weight, there are 5 to 40 parts by weight of the hole injection material, and the balance is the hole transport material.

That is, in a case where there are 90 to 99 parts by weight of the host material, since there are 5 to 40 parts by weight of the hole injection material, there may be 50 to 94 parts by weight of the hole transport material.

Here, in the example where 1 part is 1 g again, the mass of the host material is in the range of 90 g to 99 g, a mass of the hole injection material is in a range of 5 g to 40 g, inclusive, and the balance is the hole transport material.

For example, in an example where the mass of the host material is 90 g, in a case where the mass of the hole injection material is 5 g, the mass of the hole transport material is 90 g minus 5 g, which is equal to 85 g; in a case where the mass of the hole injection material is 40 g, the mass of the hole transport material is 90 g minus 40 g, which is equal to 50 g; in a case where the mass of the hole injection material is 20 g, the mass of the hole transport material is 90 g minus 20 g, which is equal to 70 g; in a case where the mass of the hole injection material is 30 g, the mass of the hole transport material is 90 g minus 30 g, which is equal to 60 g.

In an example where the mass of the host material is 99 g, in a case where the mass of the hole injection material is 5 g, the mass of the hole transport material is 99 g minus 5 g, which is equal to 94 g; in a case where the mass of the hole injection material is 40 g, the mass of the hole transport material is 99 g minus 40 g, which is equal to 59 g; in a case where the mass of the hole injection material is 20 g, the mass of the hole transport material is 99 g minus 20 g, which is equal to 79 g; in a case where the mass of the hole injection material is 30 g, the mass of the hole transport material is 99 g minus 30 g, which is equal to 69 g.

In some embodiments, in a case where the host material is determined in part by weight, there are 25 to 35 parts by weight of the hole injection material, and the balance is the hole transport material.

That is, in the case where there are 90 to 99 parts by weight of the host material, since there are 25 to 35 parts by weight of the hole injection material, there may be 55 to 74 parts by weight of the hole transport material.

Here, in the example where 1 part is 1 g again, the mass of the host material is in the range of 90 g to 99 g, the mass of the hole injection material is in a range of 25 g to 35 g, inclusive, and the balance is the hole transport material.

In the example where the mass of the host material is 90 g, in a case where the mass of the hole injection material is 25 g, the mass of the hole transport material is 90 g minus 25 g, which is equal to 65 g; in a case where the mass of the hole injection material is 35 g, the mass of the hole transport material is 90 g minus 35 g, which is equal to 55 g; in a case where the mass of the hole injection material is 30 g, the mass of the hole transport material is 90 g minus 30 g, which is equal to 60 g.

In the example where the mass of the host material is 99 g, in a case where the mass of the hole injection material is 25 g, the mass of the hole transport material is 99 g minus 25 g, which is equal to 74 g; in a case where the mass of the hole injection material is 35 g, the mass of the hole transport material is 99 g minus 35 g, which is equal to 64 g; in a case where the mass of the hole injection material is 30 g, the mass of the hole transport material is 99 g minus 30 g, which is equal to 69 g.

In an example where the mass of the host material is 93 g, in a case where the mass of the hole injection material is 25 g, the mass of the hole transport material is 93 g minus 25 g, which is equal to 68 g; in a case where the mass of the hole injection material is 35 g, the mass of the hole transport material is 93 g minus 35 g, which is equal to 58 g; in a case where the mass of the hole injection material is 30 g, the mass of the hole transport material is 93 g minus 30 g, which is equal to 63 g.

In an example where the mass of the host material is 97 g, in a case where the mass of the hole injection material is 25 g, the mass of the hole transport material is 97 g minus 25 g, which is equal to 72 g; in a case where the mass of the hole injection material is 35 g, the mass of the hole transport material is 97 g minus 35 g, which is equal to 62 g; in a case where the mass of the hole injection material is 30 g, the mass of the hole transport material is 97 g minus 30 g, which is equal to 67 g.

In an example where the mass of the host material is 95 g, in a case where the mass of the hole injection material is 25 g, the mass of the hole transport material is 95 g minus 25 g, which is equal to 70 g; in a case where the mass of the hole injection material is 35 g, the mass of the hole transport material is 95 g minus 35 g, which is equal to 60 g; in a case where the mass of the hole injection material is 30 g, the mass of the hole transport material is 95 g minus 30 g, which is equal to 65 g.

In some embodiments, in a case where the material with the hole injection function and/or the hole transport function is used for the hole injection layer 134a, and the light-emitting device 13 may further include at least one of the hole transport layer 134b, the electron blocking layer 134c, the electron injection layer 134d, the electron transport layer 134e and the hole blocking layer 134f, a material of the hole transport layer 134b may be any one selected from or a mixture of two or more selected from N,N'-Bis(1-naphthalenyl)-N,N'-bisphenyl-(1,1'-biphenyl)-4,4'-diamine (NPB), N,N'-diphenyl-N,N'-di(3-methylphenyl)-1,1'-biphenyl-4,4'-diamine (TPD), triphenylamine tetramer (TPTE) and 1,3,5-Tris[(3-methylphenyl)phenylamino]benzene (m-TDAB). A thickness of the hole transport layer 134b may be in a range of 100 nm to 130 nm, inclusive.

A material of the electron blocking layer 134c may be any one selected from or a mixture of 2-(4-tert-Butylphenyl)-5-(4-biphenyl)-1,3,4-oxadiazole and 3-(Biphenyl-4-yl)-5-(4-tert-butylphenyl)-4-phenyl-4H-1,2,4-triazole. A thickness of the electron blocking layer 134c may be in a range of 5 nm to 10 nm, inclusive.

A material of the electron injection layer 134d may be any one selected from or a mixture of two or more selected from alkali metal fluorides MF (M may be selected from Li, Na, K, Rb and Cs), $Li_2O$ and $LiBO_2$. A thickness of the electron injection layer 134d may be in a range of 5 nm to 10 nm, inclusive.

A material of the electron transport layer 134e is any one selected from or a mixture of two or more selected from 2-(4-Biphenylyl)-5-(4-tert-butylphenyl)-1,3,4-oxadiazole (PBD), 2,5-Di(1-naphthyl)-1,3,4-oxadiazole (BND) and 2,4,6-triphenoxy-1,3,5-triazine (TRZ). A thickness of the electron transport layer 134e may be in a range of 10 nm to 40 nm, inclusive.

In some embodiments, the light-emitting substrate 1 may further include a light extraction layer 14 disposed on the substrate 11 and located on a side of the plurality of light-emitting devices 13 away from the substrate. The light extraction layer 14 is configured to extract light emitted from the plurality of light-emitting devices 13. That is, the light-emitting substrate 1 may be a top-emission light-emitting substrate.

The light extraction layer 14 is made of a material with a high refractive index, and destroys total reflection inside the light-emitting device 13 by using refraction and total reflection of light to extract the light.

The refractive index of the material of the light extraction layer 14 may be greater than or equal to 1.8.

Some embodiments of the present disclosure provide a manufacturing method of a light-emitting substrate, and the manufacturing method includes a following step.

A plurality of light-emitting devices 13 are formed on a substrate 11. A material of a functional layer 134 in at least one light-emitting device 13 is the material with the hole injection function and/or the hole transport function as described above. The material with the hole injection function and/or the hole transport function includes the host material and the crystallisation inhibitor doped in the host material. The crystallisation inhibitor is capable of inhibiting crystallisation of the host material during evaporation. Moreover, the crystallisation inhibitor has the hole injection function and/or the hole transport function.

In some embodiments, in a case where the light-emitting substrate 1 includes a pixel defining layer 12, and the pixel defining layer 12 has a plurality of openings Q, forming the plurality of light-emitting devices 13 on the substrate 11 may include a following step.

A thin film 300 with a hole injection function and/or a hole transport function is formed on a side of the pixel defining layer 12 away from the substrate 11 on the substrate 11 by an evaporation process. The thin film 300 with the hole injection function and/or the hole transport function includes portions each located in an opening Q and a portion located outside each opening Q. The portion of the thin film 300 with the hole injection function and/or the hole transport function located in the opening Q constitutes a functional layer 134 included in a light-emitting device 13.

In these embodiments, the thin film 300 with the hole injection function and/or the hole transport function may be formed on the substrate 11 by evaporating the material with the hole injection function and/or the hole transport function. That is, the functional layer 134 (e.g., the hole injection layer 134*a*) included in each light-emitting device 13 may be formed on the substrate 11. In this process, since the material with the hole injection function and/or the hole transport function include the host material and the crystallisation inhibitor, in a case where the host material is the hole injection material, compared with a separate evaporation of the hole injection material, the addition of the crystallisation inhibitor may avoid crystal blockage. Compared with a common evaporation of the hole transport material and the p-type dopant material, a doping amount of the p-type dopant material in the hole transport material may be increased, and signal crosstalks between the light-emitting device emitting red light, the light-emitting device emitting blue light and the light-emitting device emitting green light do not occur. The problem of crystal blockage and poor thermal stability of the device caused by the separate evaporation of the hole injection material, and the problem of signal crosstalks between the light-emitting device emitting red light, the light-emitting device emitting blue light and the light-emitting device emitting green light caused by the common evaporation of the hole transport material and the p-type dopant material in the related art are solved.

The above description is given only in an example where the functional layer is the hole injection layer 134*a*, and those skilled in the art may understand that the above method is also applicable to a case that the functional layer 134 is the hole transport layer 134*b*.

In some embodiments, in a case where the light-emitting substrate 1 further includes a light extraction layer 14, the manufacturing method of the light-emitting substrate 1 may further include: forming the light extraction layer 14 by an evaporation process or an inkjet printing process.

In order to objectively evaluate the technical effects of the embodiments provided in the present disclosure, the present disclosure will be exemplarily described below with reference to comparative examples and experimental examples.

It will be noted that in the following comparative examples and experimental examples, a description will be made in an example where the functional layer 134 serves as the hole injection layer 134*a*. A material, a thickness and a manufacturing method of other functional material layer, such as the hole transport layer 134*b*, the hole blocking layer 134*f*, the electron injection layer 134*d*, the electron transport layer 134*e*, the electron blocking layer 134*c*, or even a light-emitting layer emitting red light, a light-emitting layer emitting green light or a light-emitting layer emitting blue light are respectively the same as those of the hole injection layer 134*a*. Moreover, the functional layer 134 is manufactured on the substrate 11 on which the pixel defining layer 12 is formed by evaporation. Only a material and a manufacturing method of the functional layer 134 during the manufacturing of the light-emitting substrate 1 will be described below.

Comparative Example 1

In Comparative example 1, the functional layer 134 is made of a hole injection material, such as Hexaazatriphenylenehexacarbonitrile (HAT-CN). A thin film with a hole injection function is formed on the substrate 11 on which the pixel defining layer 12 is formed by evaporation.

Comparative Example 2

In Comparative example 2, the functional layer 134 is made of a hole transport material, such as N,N'-Bis(1-naphthalenyl)-N,N'-bisphenyl-(1,1'-biphenyl)-4,4'-diamine (NPB), and the hole transport material is doped with a p-type dopant material. A thin film with a hole injection function is formed on the substrate 11 on which the pixel defining layer 12 is formed by evaporation.

Comparative Example 3

In Comparative example 3, the material of the functional layer 134 is made of a hole injection material and a hole transport material, such as Tris(4-bromophenyl)ammoniumyl hexachloroantimonate (TBAHA) and N,N'-Bis(1-naphthalenyl)-N,N'-bisphenyl-(1,1'-biphenyl)-4,4'-diamine (NPB). A mass ratio of the hole injection material to the hole transport material is, for example, 30:70. A thin film with a hole injection function is formed on the substrate 11 on which the pixel defining layer 12 is formed by evaporation.

Experimental Example 1

In Experimental example 1, the functional layer 134 is made of a hole injection material and a crystallisation inhibitor. The hole injection material is the same as the hole injection material in Comparative example 1, and the crystallisation inhibitor is N,N'-Bis(3-methylphenyl)-N,N'-bis(phenyl)benzidine. A mass ratio of the hole injection material to the crystallisation inhibitor is 90:10. A thin film with a hole injection function is formed on the substrate 11 on which the pixel defining layer 12 is formed by evaporation.

Experimental Example 2

In Experimental example 2, the functional layer 134 is made of a hole transport material and a crystallisation inhibitor. The hole transport material is the same as the hole transport material in Comparative example 2, and the crystallisation inhibitor is N,N'-Bis(3-methylphenyl)-N,N'-bis(phenyl)benzidine. A mass ratio of the hole transport material to the crystallisation inhibitor is 97:3. A thin film with a hole injection function is formed on the substrate 11 on which the pixel defining layer 12 is formed by evaporation.

Experimental Example 3

In Experimental example 3, the functional layer 134 is made of a hole injection material, a hole transport material and a crystallisation inhibitor. The hole injection material and the hole transport material are respectively the same as the hole injection material and the hole transport material in Comparative example 3, and the crystallisation inhibitor is N,N'-Bis(3-methylphenyl)-N,N'-bis(phenyl)benzidine. A mass ratio of the hole injection material, the hole transport material and the crystallisation inhibitor is 30:69:1. A thin film with a hole injection function is formed on the substrate 11 on which the pixel defining layer 12 is formed by evaporation.

In the manufactured light-emitting substrate, it is found through experiments that in Comparative example 1, Comparative example 2 and Comparative example 3, the problem of crystal blockage occurs during evaporation. However, compared with Comparative example 1, in Experimental example 1, the problem of crystal blockage during evaporation is able to be solved. Compared with Comparative example 2, in Experimental example 2, the problem of crystal blockage during evaporation is able to be solved. Compared with Comparative example 3, in Experimental example 3, the problem of crystal blockage during evaporation is able to be solved. In Comparative example 2 and Comparative example 3, signal crosstalks between the light-emitting device emitting red light, the light-emitting device emitting green light and the light-emitting device emitting blue light occur after the evaporation is completed, and accordingly, signal crosstalk does not occur in Experimental example 2 and Experimental example 3.

Figure 3:
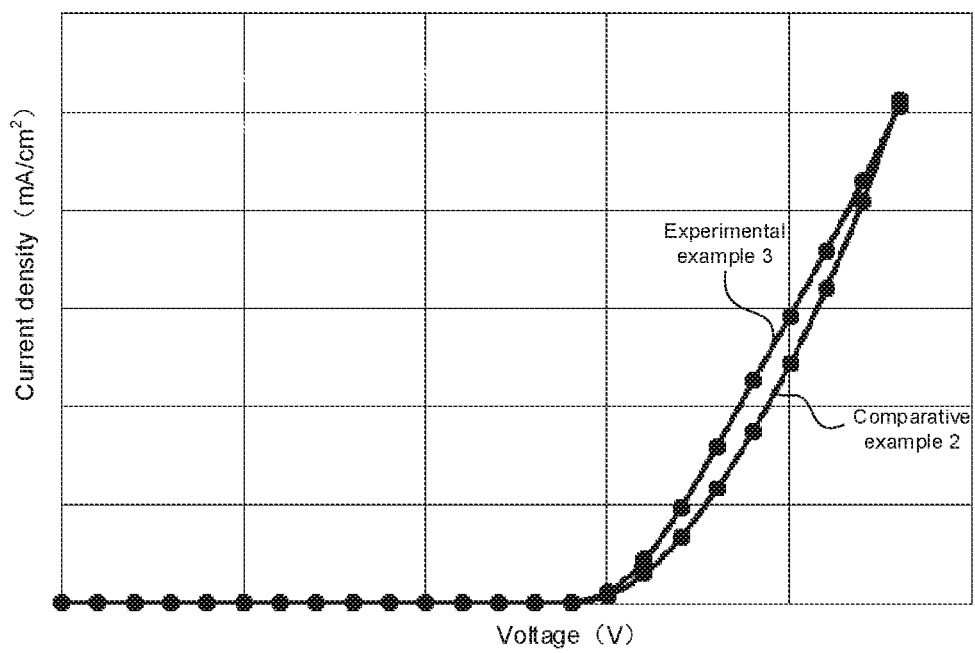
FIG. 3 is a plot of voltage versus current density for Comparative example 2 and Experimental example 3, in accordance with some embodiments.

On the basis of the above, by testing performances of devices obtained in Comparative example 2 and Experimental example 3, a plot of voltage versus current density as shown in FIG. 3 is obtained. It can be seen from FIG. 3 that electrical properties of the devices manufactured in Comparative example 2 and Experimental example 3 are basically the same, and there is no obvious problem of poor electrical properties. It can be seen that by adding the crystallisation inhibitor to the host material, the problems of blockage and signal crosstalks in the related art are able to be solved, and certain electrical performance requirements are able to be met, so that a good application value is achieved.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A material with a hole injection function and/or a hole transport function, comprising:
    a host material; and
    a crystallisation inhibitor doped in the host material;
    wherein the crystallisation inhibitor is capable of inhibiting crystallisation of the host material during evaporation, and has a hole injection function and/or a hole transport function; and
    based on 100 parts by weight of the material with the hole injection function and/or the hole transport function, there are 90 to 99 parts by weight of the host material and 1 to 10 parts by weight of the crystallisation inhibitor.

2. The material with the hole injection function and/or the hole transport function according to claim 1, wherein
    the host material includes at least one of a hole injection material and a hole transport material.

3. The material with the hole injection function and/or the hole transport function according to claim 1, wherein
    the host material includes a hole injection material and a hole transport material.

4. The material with the hole injection function and/or the hole transport function according to claim 1, wherein
    the crystallisation inhibitor is any one selected from or a mixture of two or more selected from aromatic amine derivatives.

5. The material with the hole injection function and/or the hole transport function according to claim 4, wherein the crystallisation inhibitor is any one selected from or a mixture of two or more selected from N,N'-Bis(3-methylphenyl)-N,N'-bis(phenyl)benzidine, N,N'-di(α-naphthyl)-N,N'-diphenyl-4,4'-naphthidine, N,N'-Bis(3, 4-dimethylphenyl)-N,N'-bis(phenyl)benzidine, N,N,N', N'-Tetrakis(4-methylphenyl)benzidine, and 4,4',4"-Tris[phenyl(m-tolyl)amino]triphenylamine.

6. The material with the hole injection function and/or the hole transport function according to claim 1, wherein
    there are 93 to 97 parts by weight of the host material, and the balance is the crystallisation inhibitor.

7. The material with the hole injection function and/or the hole transport function according to claim 1, wherein
    the host material includes a hole injection material and a hole transport material, and the host material is determined in part by weight; there are 5 to 40 parts by weight of the hole injection material, and the balance is the hole transport material.

8. The material with the hole injection function and/or the hole transport function according to claim 7, wherein
    there are 25 to 35 parts by weight of the hole injection material, and the balance is the hole transport material.

9. The material with the hole injection function and/or the hole transport function according to claim 2, wherein
    the hole injection material is any one selected from or a mixture of two or more selected from Hexaazatriphenylenehexacabonitrile, 2,3,5,6-Tetrafluoro-7,7,8,8-tetracyanoquinodimethane, and Tris(4-bromophenyl) ammoniumyl hexachloroantimonate.

10. The material with the hole injection function and/or the hole transport function according to claim 2, wherein
    the hole transport material is any one selected from or a mixture of two or more selected from N,N'-Bis(1-naphthalenyl)-N,N'-bisphenyl-(1,1'-biphenyl)-4,4'-diamine, N,N'-diphenyl-N,N'-di(3-methylphenyl)-1,1'-biphenyl-4,4'-diamine, TPTE and 1,3,5-Tris[(3-methylphenyl)phenylamino]benzene.

11. A light-emitting substrate, comprising:
    a substrate; and
    a plurality of light-emitting devices disposed on the substrate; wherein
    at least one light-emitting device includes: a first electrode and a second electrode that are stacked; a light-emitting layer disposed between the first electrode and the second electrode; and a functional layer disposed between the first electrode and the second electrode; wherein
    a material of the functional layer is the material with the hole injection function and/or the hole transport function according to claim 1.

12. The light-emitting substrate according to claim 11, further comprising:
    a pixel defining layer having a plurality of openings; wherein
    the plurality of light-emitting devices include a thin film with a hole injection function and/or a hole transport function that is disposed on a side of the pixel defining layer away from the substrate; the thin film with the hole injection function and/or the hole transport function includes a portion located in an opening in the openings and a portion located outside the openings; and the portion of the thin film with the hole injection function and/or the hole transport function located in the opening constitutes the functional layer included in the light-emitting device.

13. The light-emitting substrate according to claim 11, wherein the functional layer is a hole injection layer disposed between the first electrode and the light-emitting layer, and a thickness of the hole injection layer is in a range of 1 nm to 10 nm, inclusive.

14. The light-emitting substrate according to claim 11, wherein the at least one light-emitting device includes at least one of a light-emitting device emitting red light, a light-emitting device emitting green light or a light-emitting device emitting blue light.

15. A light-emitting apparatus, comprising the light-emitting substrate according to claim 11.

16. A manufacturing method of a light-emitting substrate, comprising:

forming a plurality of light-emitting devices on a substrate; wherein at least one light-emitting device includes: a first electrode and a second electrode that are stacked; a light-emitting layer formed between the first electrode and the second electrode; and a functional layer formed between the first electrode and the second electrode;

wherein a material of the functional layer is the material with the hole injection function and/or the hole transport function according to claim 1.

17. The manufacturing method of the light-emitting substrate according to claim 16, wherein the light-emitting substrate further includes a pixel defining layer having a plurality of openings; forming the plurality of light-emitting devices on the substrate includes:

forming a thin film with a hole injection function and/or a hole transport function on a side of the pixel defining layer away from the substrate on the substrate by an evaporation process; wherein the thin film with the hole injection function and/or the hole transport function includes a portion located in an opening in the openings and a portion located outside the openings; and the portion of the thin film with the hole injection function and/or the hole transport function located in the opening constitutes the functional layer included in the light-emitting device.

18. The material with the hole injection function and/or the hole transport function according to claim 6, wherein the host material includes a hole injection material and a hole transport material, and the host material is determined in part by weight; there are 5 to 40 parts by weight of the hole injection material, and the balance is the hole transport material.

19. The material with the hole injection function and/or the hole transport function according to claim 18, wherein there are 25 to 35 parts by weight of the hole injection material, and the balance is the hole transport material.

* * * * *